United States Patent [19]

Agostino et al.

[11] Patent Number: 5,262,273
[45] Date of Patent: Nov. 16, 1993

[54] PHOTOSENSITIVE REACTIVE ION ETCH BARRIER

[75] Inventors: Peter A. Agostino, Canaan, N.Y.; Frederick M. Pressman, Norwalk, Conn.

[73] Assignee: International Business Machines Corporation, Armonk, N.Y.

[21] Appl. No.: 846,300

[22] Filed: Feb. 25, 1992

[51] Int. Cl.$^5$ ............................................. G03C 1/492
[52] U.S. Cl. .................................. 430/270; 430/942; 525/480; 525/506; 528/29
[58] Field of Search ............... 430/270, 942; 525/480, 525/506; 528/29

[56] References Cited

U.S. PATENT DOCUMENTS

| | | | |
|---|---|---|---|
| 2,182,208 | 12/1939 | Nason | 260/19 |
| 2,413,582 | 12/1946 | Rust et al. | 260/607 |
| 2,707,191 | 4/1955 | Martin et al. | 260/448.8 |
| 2,920,058 | 1/1960 | Brown | 260/43 |
| 3,398,122 | 8/1968 | Shepard et al. | 260/50 |
| 3,481,901 | 12/1969 | Prochaska | 260/49 |
| 3,911,169 | 10/1975 | Lesaicherre et al. | 427/96 |
| 4,045,397 | 8/1977 | Parkinson | 260/29.3 |
| 4,237,259 | 12/1980 | Keeley | 528/204 |
| 4,238,375 | 12/1980 | Blount | 260/18 |
| 4,451,969 | 6/1984 | Chaudhuri | 427/74 |
| 4,565,846 | 1/1986 | Saito et al. | 525/101 |
| 4,599,243 | 7/1986 | Sachdev et al. | 427/38 |
| 4,631,322 | 12/1986 | Isayama et al. | 525/480 |
| 4,692,398 | 12/1987 | Durham | 430/329 |
| 4,751,170 | 6/1988 | Mimura et al. | 430/296 |
| 4,770,974 | 9/1988 | Hiraoka | 430/270 |
| 4,782,008 | 11/1988 | Babich et al. | 430/313 |
| 4,806,458 | 2/1989 | Durham | 430/331 |

FOREIGN PATENT DOCUMENTS

| | | | |
|---|---|---|---|
| 3013947 | 1/1991 | Japan | 430/270 |
| 3046659 | 2/1991 | Japan | 430/270 |

OTHER PUBLICATIONS

M. Toriumi et al., Alkali-Developable Silicon Containing Positive Photoresist(ASTRO) for a Two-Layer Resist System, J. Electrochem Soc., vol. 134, No. 4, Apr. 1987.

Y. Saotome et al., A Silicon Containing Positive Photoresist for a Bilayer Resist System, J. Electrochem. Soc., Apr. 1985.

F. Coopmans et al., DESIRE: A New Route to Submicron Optical Lithography, Solid State Technology, Jun. 1987.

F. Watanabe et al., Oxygen reactive ion etching of organosilicon polymers, J. Vac. Sci. Technol. B 4 (1), Jan./Feb. 1986.

C. W. Wilkins, Jr. et al., An organosilicon novalac resin for multilevel resist applications, J. Vac. Sci. Technol., Jan./Feb. 1985.

*Primary Examiner*—Marion E. McCamish
*Assistant Examiner*—Janis L. Dote
*Attorney, Agent, or Firm*—Whitham & Marhoefer

[57] ABSTRACT

Reaction products of organosilane compounds and a novolac resin having phenolic groups have been found to have a very low rate of etching, thereby enabling the material to also be used as an RIE barrier in semiconductor manufacturing processes. A particular photosensitive material has the following chemical formula:

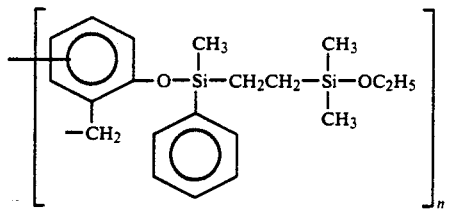

3 Claims, 1 Drawing Sheet

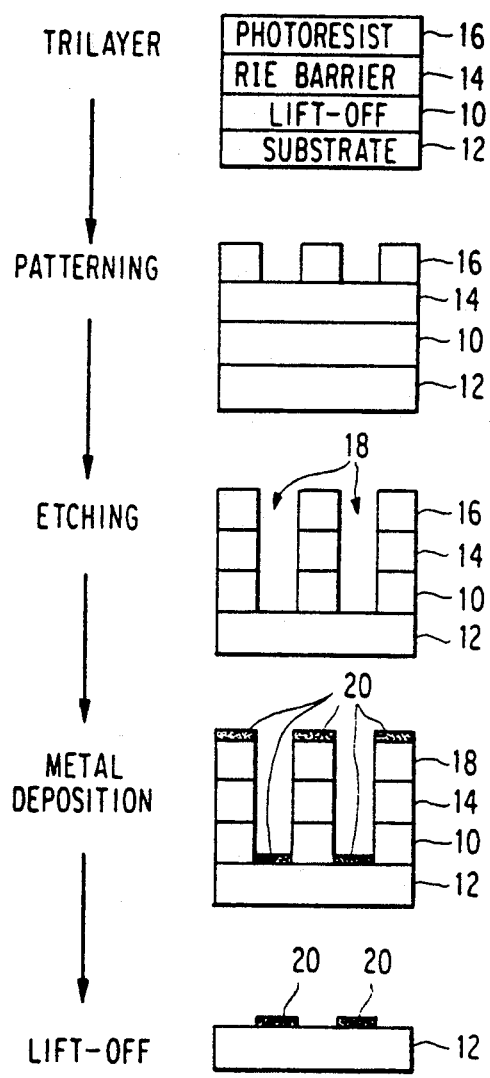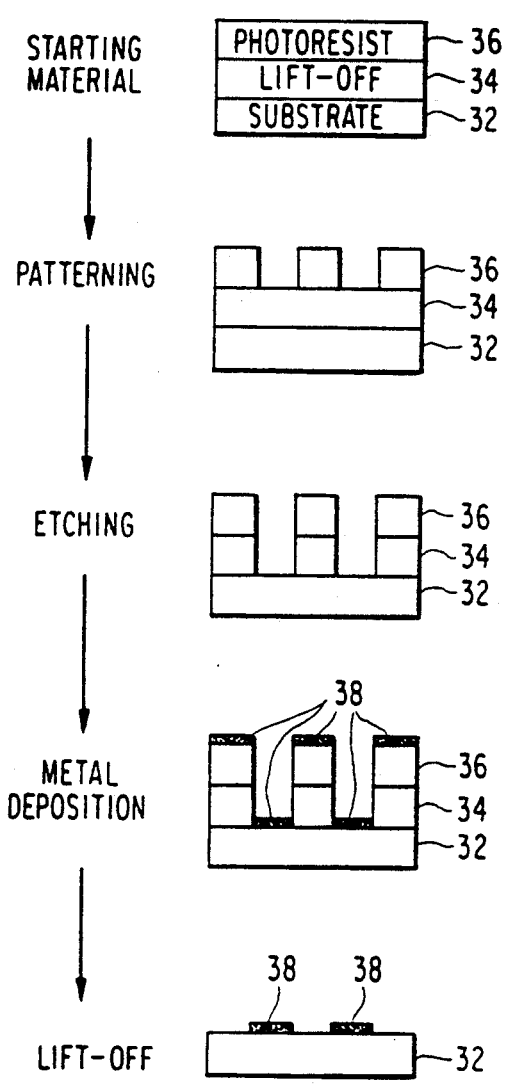

PHOTOSENSITIVE REACTIVE ION ETCH BARRIER

BACKGROUND OF THE INVENTION

1. Field of the Invention

The present invention is generally related to a photoresist material and, more particularly, to a photoresist material which can be effectively used as a reactive ion etch (RIE) barrier.

2. Description of the Prior Art

Photoresist materials are widely used in the semiconductor industry. A photoresist material can be easily patterned by imaging and developing, and the pattern created can then be transferred to an underlying substrate by etching. However, the known photoresist materials tend to erode themselves during etching, thereby limiting their utility as a stencil for patterning a substrate. Therefore, much effort has been made in using reactive ion etch (RIE) barriers in combination with photoresists and in chemically or physically altering a photoresist after patterning so that it will have the qualities of an RIE barrier. The RIE barriers are more resistant to etching and protect the underlying substrate in regions which are not to be patterned by etching.

FIG. 1 shows the process steps of a well known trilayer technique. First, a lift-off polymer 10 is applied to a wafer or substrate 12. A RIE barrier layer 14, such as hexamethyldisilazane (HMDS), silicon nitride ($Si_3N_4$), or silicon dioxide ($SiO_2$, often called quartz), is then applied over the lift-off polymer 10. Finally, a photoresist layer 16 is applied to the top to complete the trilayer structure. The lift-off polymer, RIE barrier layer, and photoresist layer can be applied by many well known techniques including using a plasma tool or by spinning procedures. The photoresist layer 16 is then patterned by imaging and developing. The pattern 18 is then transferred to the substrate 10 by first etching the RIE barrier layer 14 with $CF_4$ and then etching the lift-off polymer 10 with $O_2$ RIE. During $O_2$ RIE, the photoresist 16 may erode away, however, the RIE barrier layer 14 remaining under the photoresist 16 will protect the underlying substrate 10. Metal 20 is then blanket deposited by evaporation or by other suitable techniques with the trilayer stacks serving as a stencil. Finally, the trilayer stacks are removed by dissolving the lift-off polymer 10 with an appropriate solvent. The trilayer process is expensive in that additional materials, process steps, and plasma tools are required.

SUMMARY OF THE INVENTION

It is an object of the invention to provide a photoresist material which can be used as an RIE barrier without additional processing steps.

It is another object of the invention to provide a low cost method of patterning substrates which eliminates the requirement of applying a separate RIE barrier layer.

According to the invention, a photosensitive material which is suitable for use as an RIE barrier layer after patterning is synthesized by the reaction of a novolac resin with 1-methylphenylchlorosilylethyldimethylethoxysilane. Hence, the photoresist need only be patterned by conventional means and no conversion treatment of the photoresist is required prior to patterning the substrate by RIE.

BRIEF DESCRIPTION OF THE DRAWINGS

The foregoing and other objects, aspects and advantages will be better understood from the following detailed description of the preferred embodiments of the invention with reference to the drawings, in which:

FIG. 1 are sequential cross-sectional side views of a substrate being patterned with metal by a prior art trilayer process; and FIG. 2 are sequential cross-sectional side views of a substrate being patterned with metal using the inventive photosensitive material.

DETAILED DESCRIPTION OF A PREFERRED EMBODIMENT OF THE INVENTION

A photosensitive material which can also be used as an effective RIE barrier has been synthesized by reacting a novolac with a substituted silane compound. Novolacs define a well known group of phenol-formaldehyde polymers and are commercially available from a variety of sources including Hoechst Celanese and Aldrich. Novolacs contemplated by this invention have phenolic groups. The silane compound used in the production of a photosensitive material within the scope of the present invention was synthesized by the reaction of methylphenylchlorosilane with vinyldimethylethoxysilane. A particular photosensitive compound within the present invention was made according to the following reaction scheme:

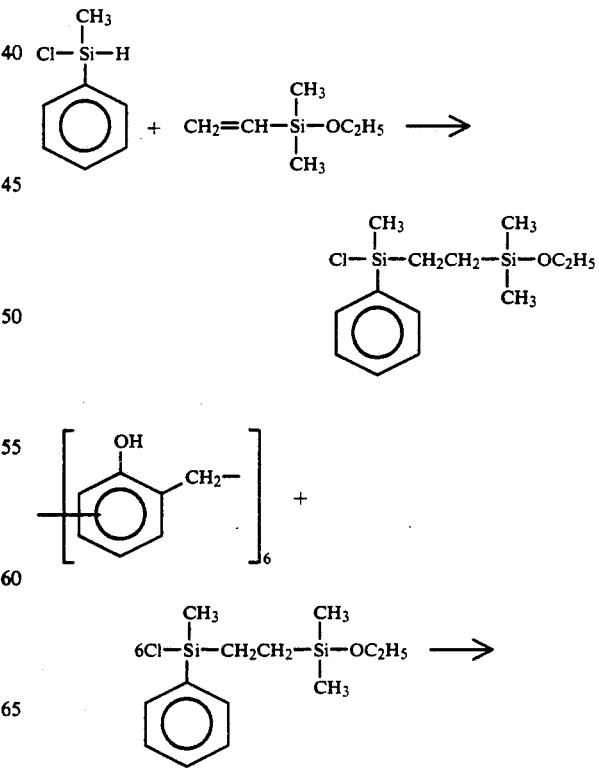

-continued

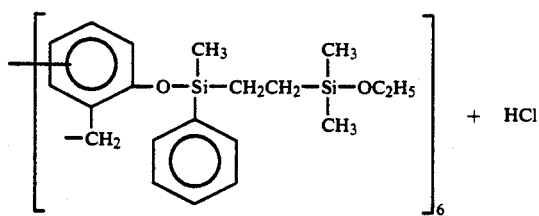

+ HCl

In the synthesis of the photosensitive material, 1-methylphenylchlorosilylethyldimethylethoxysilane was synthesized by first reacting 35.0 grams of methylphenylchlorosilane and 28.0 grams of vinyldimethylethoxysilane at room temperature in the presence of a trace amount of hydrogen and hexachloroplatinate (IV) hydrate. Methylphenylchlorosilane and vinyldimethylethoxysilane are commercially available from Petrarch. 10.7 grams of Alnovol PN430 was then mixed with 80 ml n-butylacetate and heated to a temperature of 126° C. The heated solution was stirred and the 1-methylphenylchlorosilyl-ethyldimethylethoxysilane solution was added dropwise. Alnovol PN430 is commercially available from Aldrich. The combined solution was refluxed in n-butylacetate until the evolution of HCl gas ceased, signifying the endpoint of the reaction. HCl gas is the reaction product of the two compounds where Cl acts as a leaving group on the silane and the H leaves the hydroxyl on the phenol. The solution was then filtered and 1.68 grams of a photoactive compound was added. The resulting resin material has n=6 repeat units and was found to be both photosensitive and highly resistant to etching reactions. It should be understood that the resin material could be made by other methods on an industrial scale.

In a test experiment, 10 ml of the resin having the combined novolac and silane was mixed with a photoactive compound and spun on a wafer. After an 85° C. bake for 30 minutes, the wafer and resin structure was exposed to ultraviolet (UV) light at 50 mw/cm². Developing was performed in an AZ 400 developer for five seconds. AZ 400 is a developer which is commercially available from Shipley Company. Imaging and developing proceeded very smoothly to leave a distinct pattern of resin on top of the wafer. The resin was then subjected to RIE in an O₂ ambient at 300 mtorr, 200 cc O₂ and 1000 watts. The resin was found to have an etch rate of 30 Angstroms/min. Etch rates of photoresists are about 5000 Å/min while those of typical RIE barrier layers are in the 100 Å/min or lower range.

FIG. 2 shows an improved process of using the improved photoresist/RIE barrier materials fabricated according to the present invention. A substrate 32 is overcoated with a lift-off layer 34 and a photoresist 36. The photoresist 36 is a reaction product of a silane and a novolac and has the advantages of being both photosensitive for patterning purposes and resistant to etching so that it may protect underlying sections of the substrate 32. Preferably, the photoresist 36 has the following formula:

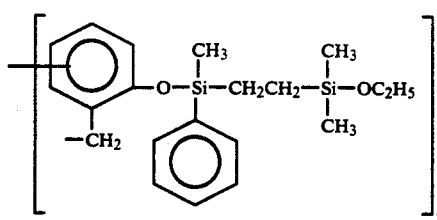

The photoresist 36 is patterned by imaging with ultraviolet light and developing. Then the combined structure is subjected to RIE etching in O₂ or another similar ambient. Because of the low rate of etching of the photoresist 36, approximately 14 Å/min, no hardening or chemical conversion procedure is required prior to RIE etching. Metal 38 is then blanket deposited using the photoresist 36 and lift-off polymer as a stencil. The stencil is removed simply by dissolving the lift-off polymer.

While the invention has been described in terms of a single preferred embodiment where the reaction product of a particular novolac compound and a particular silane compound exhibits both photosensitive and RIE barrier properties, those skilled in the art will recognize that invention can be practiced with modification within the spirit and scope of the appended claims.

Having thus described out invention, our invention, what we claim as new and desire to secure by Letters Patent is as follows:

1. A photoresist material, consisting essentially of the reaction product of a novolak resin having phenolic groups and 1-methylphenylchlorosilylethyldimethylethoxysilane.

2. A photoresist material as recited in claim 1 having the following chemical formula:

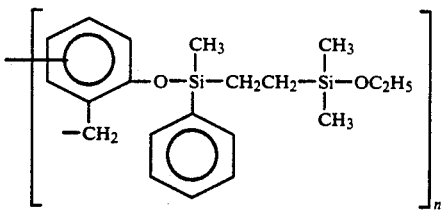

wherein N is greater than 1.

3. A photoresist material as recited in claim 2 wherein n=6.

* * * * *